(12) United States Patent
Park et al.

(10) Patent No.: US 12,520,647 B2
(45) Date of Patent: Jan. 6, 2026

(54) LIGHT-EMITTING DEVICE

(71) Applicant: SAMSUNG DISPLAY CO., LTD., Yongin-si (KR)

(72) Inventors: Jinjoo Park, Suwon-si (KR); Joosung Kim, Suwon-si (KR); Younghwan Park, Suwon-si (KR); Dongchul Shin, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 433 days.

(21) Appl. No.: 18/085,806

(22) Filed: Dec. 21, 2022

(65) Prior Publication Data

US 2024/0038820 A1    Feb. 1, 2024

(30) Foreign Application Priority Data

Aug. 1, 2022 (KR) .................. 10-2022-0095693

(51) Int. Cl.
   *H10H 29/14*    (2025.01)
   *H10H 20/812*    (2025.01)
   *H10H 20/813*    (2025.01)
   *H10H 20/825*    (2025.01)

(52) U.S. Cl.
CPC ........ *H10H 29/142* (2025.01); *H10H 20/812* (2025.01); *H10H 20/813* (2025.01); *H10H 20/825* (2025.01)

(58) Field of Classification Search
CPC ............... H10H 20/813; H10H 20/825; H10H 20/812; H10H 29/142
See application file for complete search history.

(56) References Cited

U.S. PATENT DOCUMENTS

| | | | |
|---|---|---|---|
| 7,915,622 | B2 | 3/2011 | Wang |
| 8,653,499 | B2 | 2/2014 | Lee |
| 11,005,004 | B2 | 5/2021 | Cho et al. |
| 2003/0107047 | A1 | 6/2003 | Okuyama et al. |
| 2013/0015477 | A1 | 1/2013 | Kim et al. |
| 2019/0123235 | A1* | 4/2019 | Cho .................... H10H 20/821 |
| 2020/0135976 | A1* | 4/2020 | Dussaigne .......... H10H 20/812 |

(Continued)

FOREIGN PATENT DOCUMENTS

KR     10-1322927 B1    10/2013

OTHER PUBLICATIONS

T. Wang, "Topical Review: Development of overgrown semi-polar GaN for high efficiency green/yellow emission", Semiconductor Science Technology, IOP Publishing Ltd, GB, vol. 31, No. 9, Aug. 10, 2016, p. 93003, XP020307836.

(Continued)

*Primary Examiner* — Mark W Tornow
(74) *Attorney, Agent, or Firm* — Sughrue Mion, PLLC

(57) ABSTRACT

A light-emitting device includes a base semiconductor layer, a three-dimensional (3D) light-emitting structure, and a flat light-emitting structure formed in a flat shape, wherein the flat light-emitting structure generates light having a different wavelength than that of the 3D light-emitting structure. A strain-relieving layer relieving lattice mismatch between the base semiconductor layer and the flat light-emitting structure may be arranged on the base semiconductor layer in an area in which at least the flat light-emitting structure is formed.

24 Claims, 16 Drawing Sheets

(56) References Cited

U.S. PATENT DOCUMENTS

2021/0242017 A1\* 8/2021 Yamamoto ........ H01L 21/02381
2023/0282685 A1\* 9/2023 Liu ...................... H10H 20/815
                                                              257/89

OTHER PUBLICATIONS

European Extended Search Report issued Aug. 21, 2023 issued by the European Patent Office for EP Patent Application No. 22213872.9.

\* cited by examiner

LIGHT-EMITTING DEVICE

CROSS-REFERENCE TO RELATED APPLICATION

This application is based on and claims priority under 35 U.S.C. § 119 to Korean Patent Application No. 10-2022-0095693, filed on Aug. 1, 2022, in the Korean Intellectual Property Office, the disclosure of which is incorporated by reference herein in its entirety.

BACKGROUND

1. Field

The disclosure relates to a semiconductor light-emitting device.

2. Description of the Related Art

A semiconductor light-emitting device (LED) has been used in various fields of displays, optical communications, automobiles, general lighting, etc. as a high-efficient and eco-friendly light source. An LED may have different light emission wavelengths according to a type and composition of a material included in an active layer. Three types of LEDs each emitting blue light, green light, and red light may be used in a color display and may be aligned on a driving substrate. Alignment accuracy of the LEDs may affect the image quality of the color display. The resolution of color displays has increased recently, and to achieve a high resolution, the size of the LEDs needs to be reduced; however, it is difficult to align such small LEDs on a driving substrate with high accuracy.

SUMMARY

Provided is a monolithic light-emitting device configured to generate multi-wavelength light.

Additional aspects will be set forth in part in the description which follows and, in part, will be apparent from the description, or may be learned by practice of embodiments of the disclosure.

In accordance with an aspect of the disclosure, a light-emitting device includes a base semiconductor layer; a three-dimensional (3D) light-emitting structure on the base semiconductor layer, the 3D light-emitting structure including at least one semi-polar surface; a flat light-emitting structure on the base semiconductor layer, the flat light-emitting structure including a polar surface, wherein the flat light-emitting structure generates light having a wavelength different from a wavelength of light generated by the 3D light-emitting structure; and a strain-relieving layer formed on the base semiconductor layer in an area of the light-emitting device in which at least the flat light-emitting structure is formed, wherein the strain-relieving layer relieves lattice mismatch between the base semiconductor layer and the flat light-emitting structure.

The strain-relieving layer may include a superlattice layer.

The base semiconductor layer, the 3D light-emitting structure, and the flat light-emitting structure may include a GaN-based material, and the strain-relieving layer may include a GaN-based superlattice layer.

An indium composition of the flat light-emitting structure may be higher than an indium composition of the 3D light-emitting structure.

The wavelength of the light generated by the flat light-emitting structure may be longer than the wavelength of the light generated by the 3D light-emitting structure.

The 3D light-emitting structure may include a first light-emitting structure and a second light-emitting structure, which generate light of different wavelengths from each other.

The first light-emitting structure and the second light-emitting structure may generate blue light and green light, respectively, and the flat light-emitting structure may generate red light.

A mask layer including a pattern may be further formed on the base semiconductor layer, wherein a first conductivity type semiconductor layer of the 3D light-emitting structure is grown on the base semiconductor layer through the pattern, and wherein the pattern includes a hole pattern or a stripe pattern.

The mask layer may include at least one from among $SiO_2$, $TiO_2$, $Si3N_4$, $Al_2O_3$, TiN, AlN, $ZrO_2$, TiAlN, and TiSiN.

The 3D light-emitting structure may include a first light-emitting structure and a second light-emitting structure, which generate light of different wavelengths from each other, the pattern may include a first pattern which corresponds to the first light-emitting structure and a second pattern which corresponds to the second light-emitting structure, the first pattern may include a first hole pattern or a first stripe pattern, and the second pattern may include a second hole pattern or a second stripe pattern.

The first pattern and the second pattern may be different in at least one of size and pitch.

The second light-emitting structure may generate light having a longer wavelength than that of the first light-emitting structure, and a pitch of the second pattern may be greater than a pitch of the first pattern.

The strain-relieving layer may be formed on the base semiconductor layer in an area including an area in which the flat light-emitting structure is formed and an area in which the 3D light-emitting structure is formed.

A mask layer including a pattern may be further formed on the strain-relieving layer, wherein a first conductivity type semiconductor layer of the 3D light-emitting structure is grown on the strain-relieving layer through the pattern, and wherein the pattern includes a hole pattern or a stripe pattern.

The base semiconductor layer may include GaN doped with a first conductivity type impurity.

The 3D light-emitting structure may include a GaN-based light-emitting structure including a first conductivity type semiconductor layer formed in a 3D shape, an active layer including a multi-quantum-well structure covering a surface of the first conductivity type semiconductor layer, and a second conductivity type semiconductor layer covering the active layer.

The flat light-emitting structure may include a GaN-based light-emitting structure including a first conductivity type flat semiconductor layer, a flat active layer including a multi-quantum-well structure on the first conductivity type flat semiconductor layer, and a second conductivity type flat semiconductor layer on the flat active layer.

In accordance with an aspect of the disclosure, a light-emitting device includes a base semiconductor layer; a strain-relieving layer on the base semiconductor layer; a mask layer including a pattern, wherein the mask layer is arranged on the strain-relieving layer and the pattern includes a hole pattern or a stripe pattern; a GaN-based three-dimensional (3D) light-emitting structure including a first conductivity type semiconductor layer grown on the strain-relieving layer through the pattern, the first conductivity type semiconductor layer including a surface including at least one semi-polar surface, an active layer including a multi-quantum-well structure covering the surface of the first conductivity type semiconductor layer, and a second conductivity type semiconductor layer covering the active layer; and a GaN-based flat light-emitting structure including a first conductivity type flat semiconductor layer on the strain-relieving layer, a flat active layer grown on a polar surface on the first conductivity type flat semiconductor layer, and a second conductivity type flat semiconductor layer on the flat active layer.

The base semiconductor layer may include an n-GaN layer, and the strain-relieving layer may include an InGaN-superlattice layer.

An indium composition of the flat light-emitting structure may be higher than an indium composition of the 3D light-emitting structure.

The flat light-emitting structure may generate light having a longer wavelength than a wavelength of light generated by the 3D light-emitting structure.

The 3D light-emitting structure may include a first light-emitting structure and a second light-emitting structure, which generate light of different wavelengths from each other.

The first light-emitting structure and the second light-emitting structure may generate blue light and green light, respectively, and the flat light-emitting structure may generate red light.

A display may include a display panel including a plurality of light-emitting devices in accordance with an above-noted aspect of the disclosure, and a driving circuit switching on or off the plurality of light-emitting devices; and a controller configured to input an on-off switching signal of the plurality of light-emitting devices to the driving circuit according to an image signal.

An electronic device may include the display in accordance with an above-noted aspect of the disclosure.

The electronic device may include any one from among a head-up display device for a vehicle, a mobile device, augmented-reality glasses, a signage, and a wearable display.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
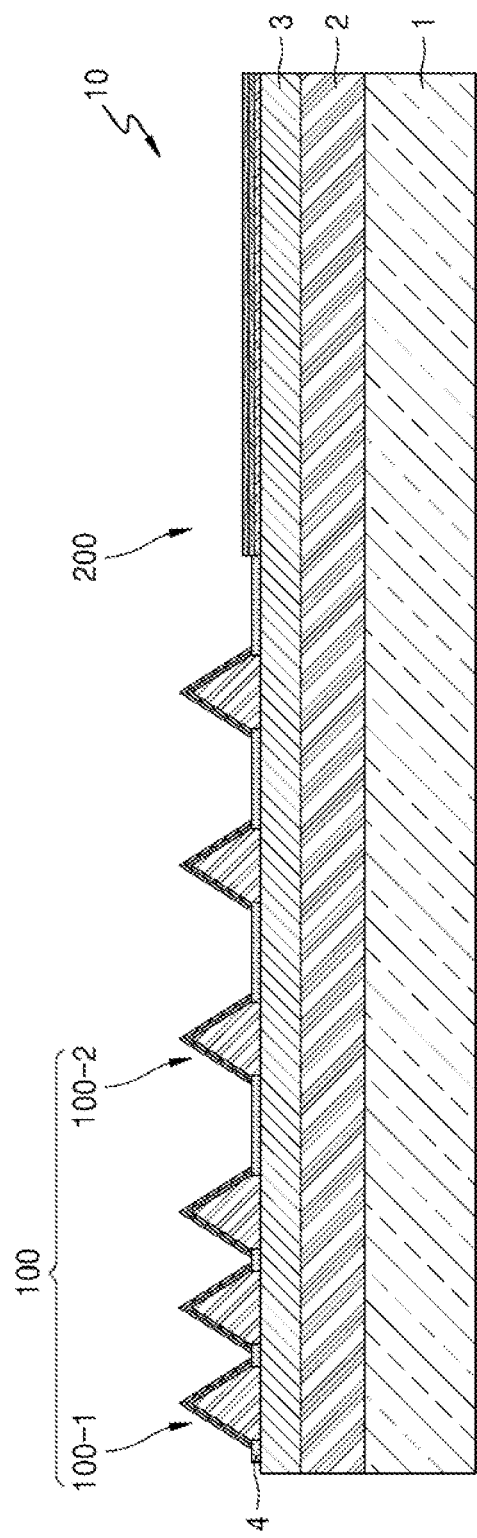
FIG. 1 is a cross-sectional view of a schematic structure of a light-emitting device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

As embodiments allow for various changes and numerous embodiments, example embodiments will be illustrated in the drawings and described in detail in the written description. The effects, features of the disclosure and methods for achieving the same may be clarified by referring to the following detailed embodiments along with the drawings. The disclosure may, however, be embodied in many different forms and should not be construed as limited to the example embodiments set forth herein.

Hereinafter, embodiments of the disclosure are explained in detail referring to the attached drawings. When referring to the drawings, like reference numerals may denote like or corresponding elements, and redundant descriptions thereof are omitted. It will be understood that although the terms "first," "second," etc. may be used herein to describe various components, these components should not be limited by these terms. These components are only used to distinguish one component from another. As used herein, the singular forms "a," "an" and "the" are intended to include the plural forms as well, unless the context clearly indicates otherwise. It will be further understood that the terms "comprises" and/or "includes" used herein specify the presence of stated features or components, but do not preclude the presence or addition of one or more other features or components. In embodiments described below, it will be understood that when a portion, such as a film, an area, a components, etc. is being referred to as being on or above another portion, one portion can be directly on another portion or an intervening film, area, component, etc. may be present thereon.

Sizes of components in the drawings may be exaggerated for convenience of explanation. In other words, since sizes and thicknesses of components in the drawings are arbitrarily illustrated for convenience of explanation, the disclosure is not limited thereto. When a certain embodiment may be implemented differently, a specific process order may be performed differently from the described order. For example, two consecutively described processes may be performed substantially at the same time or performed in an order opposite to the described order.

FIG. 1 is a cross-sectional view of a schematic structure of a light-emitting device 10 according to an embodiment. With reference to FIG. 1, the light-emitting device 10 may include a base semiconductor layer 2, a three-dimensional (3D) light-emitting structure 100, and a flat light-emitting structure 200. A strain-relieving layer 3 may be arranged between the base semiconductor layer 2 and the flat light-emitting structure 200. The strain-relieving layer 3 may be arranged between the base semiconductor layer 2 and both of the 3D light-emitting structure 100 and the flat light-emitting structure 200. The light-emitting device 10 of the disclosure may be a micro light-emitting diode (LED) generating multi-wavelength light. The light-emitting device 10 may be a monolithic micro LED generating blue light, green light, and red light.

A substrate 1 may be a growth substrate for semiconductor single crystal growth, and a silicon (Si) substrate, a silicon carbide (SiC) substrate, a sapphire substrate, etc. may be used and the substrate 1. In addition, a substrate including a material suitable for growth of the base semiconductor layer 2 to be formed on the substrate 1, for example, AlN, AlGaN, ZnO, GaAs, $MgAl_2O_4$, MgO, $LiAlO_2$, $LiGaO_2$, GaN, etc. may be used as the substrate 1.

The base semiconductor layer 2 may be formed on the substrate 1. The base semiconductor layer 2 may be a semiconductor layer doped with a first conductivity type dopant. The base semiconductor layer 2 may be formed of a group III-V nitride semiconductor material. The base semiconductor layer 2 may be formed by hydride vapor phase epitaxy (HYPE), molecular beam epitaxy (MBE), metal organic vapor phase epitaxy (MOVPE), metal organic chemical vapor deposition (MOCVD), etc. A buffer layer required for epitaxy growth may be further formed between the substrate 1 and the base semiconductor layer 2, when necessary. The base semiconductor layer 2 may have a multi-layer structure. For example, the base semiconductor layer 2 may be a GaN layer doped with an n type impurity, e.g., an n-GaN layer. Si, Ge, Se, Te, etc. may be used as the n type impurity.

The strain-relieving layer 3 may be formed on the base semiconductor layer 2. The strain-relieving layer 3 may be formed in an area in which at least the flat light-emitting structure 200 on the base semiconductor layer 2 is to be formed. In an embodiment, the strain-relieving layer 3 may be entirely formed on the base semiconductor layer 2 including the area in which the 3D light-emitting structure 100 on the base semiconductor layer 2 is to be formed. In other words, the strain-relieving layer 3 may be formed on an entirety of the base semiconductor layer 2. The strain-relieving layer 3 may relieve lattice mismatch between the base semiconductor layer 2 and the flat light-emitting structure 200 to relieve stress in a process of growing the flat light-emitting structure 200. By forming the flat light-emitting structure 200 on the strain-relieving layer 3, a high indium (In) composition may be induced, and anti-phase boundary (APB) dislocation may be reduced effectively. The strain-relieving layer 3 may include, for example, a material having a middle lattice size between a lattice size of the base semiconductor layer 2 and a lattice size of the flat light-emitting structure 200. The strain-relieving layer 3 may be a superlattice layer. For example, when GaN is employed as the base semiconductor layer 2, and the flat light-emitting structure 200 is a GaN-based light-emitting structure, the strain-relieving layer 3 may have a single-layer structure or a multi-layer structure which includes a GaN-based superlattice layer, e.g., an InGaN-superlattice layer. The strain-relieving layer 3 may be formed by HYPE, MBE, MOVPE, MOCVD, etc.

Figure 2:
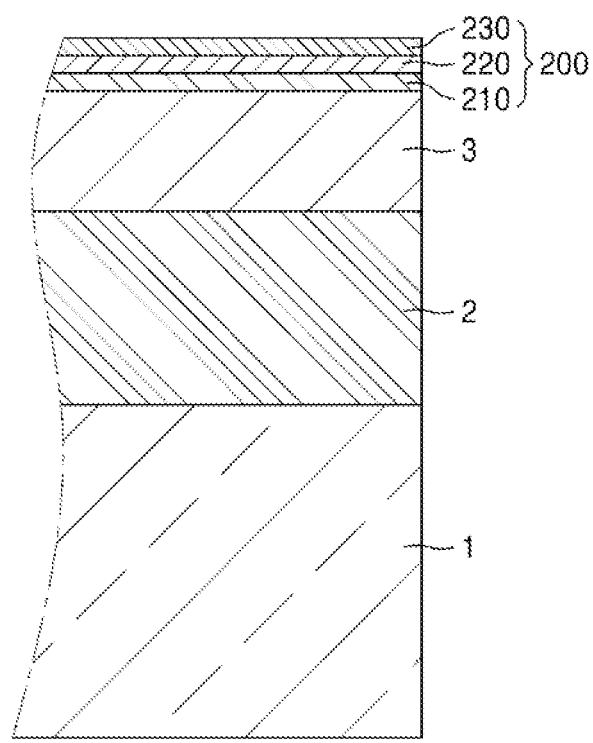
FIG. 2 is a schematic cross-sectional view of an embodiment of a flat light-emitting structure.

FIG. 2 is a schematic cross-sectional view of an embodiment of the flat light-emitting structure 200. With reference to FIG. 2, the flat light-emitting structure 200 may include a light-emitting structure having a two-dimensional (2D) plane structure. The flat light-emitting structure 200 may have, for example, a GaN-based light-emitting structure. The indium (In) composition of the flat light-emitting structure 200 may be higher than the indium (In) composition of the 3D light-emitting structure 100. Accordingly, the flat light-emitting structure 200 may generate light having a relatively longer wavelength than light generated by the 3D light-emitting structure 100. For example, the flat light-emitting structure 200 may generate red light. The flat light-emitting structure 200 may include a first conductivity type flat semiconductor layer 210, a flat active layer 220, and a second conductivity type flat semiconductor layer 230, which are formed sequentially on and parallel with the strain-relieving layer 3. The flat light-emitting structure 200 may be formed by HYPE, MBE, MOVPE, MOCVD, etc.

The first conductivity type flat semiconductor layer 210 may be formed of the same semiconductor material doped with a first conductivity type dopant as the base semiconductor layer 2. For example, the first conductivity type flat semiconductor layer 210 may be an n-GaN layer. The first conductivity type flat semiconductor layer 210 may be formed of a different semiconductor material doped with a first conductivity type dopant than a material of the base semiconductor layer 2. For example, the base semiconductor layer 2 may be an n-GaN layer and the first conductivity type flat semiconductor layer 210 may be an n-InGaN layer. The first conductivity type flat semiconductor layer 210 may be grown from the strain-relieving layer 3.

The flat active layer 220 may be a layer emitting light by electron-hole recombination. The flat active layer 220 may be grown on the first conductivity type flat semiconductor layer 210. The flat active layer 220 may have a single-quantum-well or multi-quantum-well structure made by adjusting a gap between electronic bands through periodical change of values of x, y, and z in, for example, $Al_xGa_yIn_zN$. For example, the quantum-well structure may be formed by pairing a quantum-well layer with a barrier layer in the form of InGaN/GaN, InGaN/InGaN, InGaN/AlGaN, or InGaN/InAlGaN, and the bandgap energy may be controlled according to a composition ratio of indium (In) in the InGaN layer, thereby adjusting a light emission wavelength band. In general, when the composition ratio of indium (In) is changed by 1%, the light emission wavelength may be shifted by about 5 nm.

The second conductivity type flat semiconductor layer 230 may cover a surface of the flat active layer 220. A second conductivity type flat semiconductor layer 230 may be formed of a semiconductor material doped with a second conductivity type impurity. For example, the second conductivity type flat semiconductor layer 230 may be a p-GaN layer doped with a p type impurity. Mg, Zn, Be, etc. may be used as the p type impurity.

As the existing light-emitting structures having a 2D plane structure are grown on a crystal plane in a c-axis direction (0001 plane), which is a polar surface, light of single wavelength may be generated. In addition, due to a strong internal magnetic field formed at the crystal plane in the c-axis direction (0001 plane), the internal quantum efficiency (IQE) may be low. According to the light-emitting device 10 of the embodiment, the flat light-emitting structure 200 may be grown on the strain-relieving layer 3. As described above, the strain-relieving layer 3 may be arranged between a lower structure and an upper structure to relieve the lattice mismatch between the lower structure and the upper structure, and further, to relieve the strain in the process of growing the upper structure. According to the relief of lattice mismatch, the flat light-emitting structure 200 having a relatively high indium (In) composition may be implemented. The high indium (In) composition may be a condition for generation of red light. In addition, the relief of the strain may inhibit polarization caused by the piezo-electric field effect and thus suppress the quantum confinement start effect (QCSE). Accordingly, the IQE of the flat light-emitting structure 200 may be increased. Moreover, the phenomenon that the crystal defect is induced when the indium (In) content is increased may be reduced. The high indium (In) content may remain uniform in the flat light-emitting structure 200, which leads to a higher color purity. In addition, the crystal defect affecting non-radiative recombination may be reduced, and thus, the IQE may be increased. Accordingly, the light-emitting structure generating red light with high efficiency may be implemented by the flat light-emitting structure 200 grown on the strain-relieving layer 3.

Figure 3:
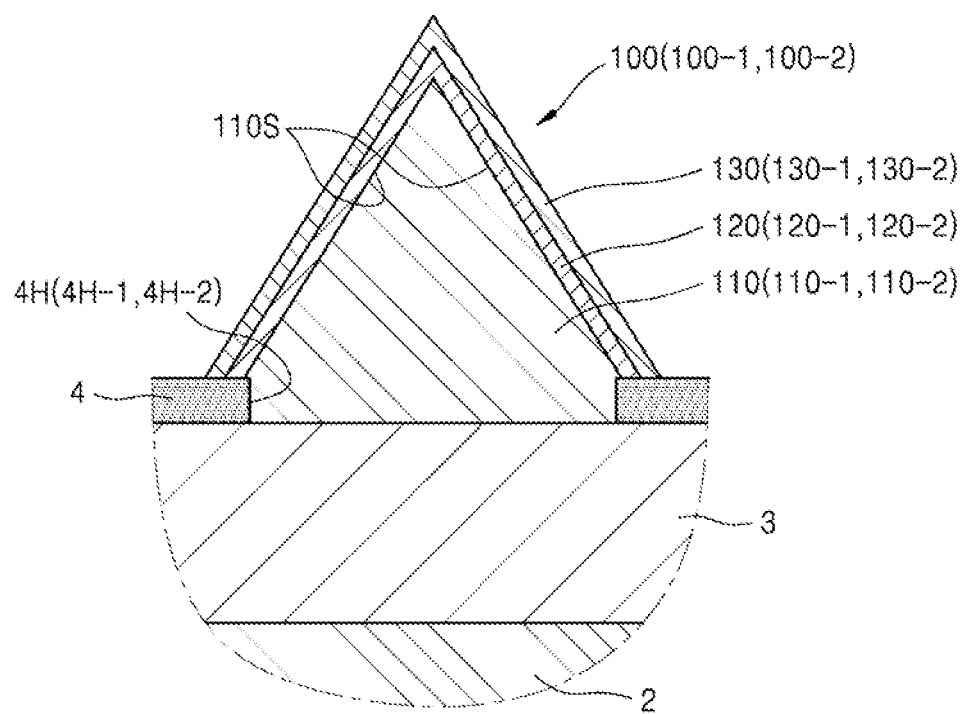
FIG. 3 is a schematic cross-sectional view of an embodiment of a three-dimensional (3D) light-emitting structure.

FIG. 3 is a schematic cross-sectional view of an embodiment of the 3D light-emitting structure 100. With reference to FIG. 3, the 3D light-emitting structure 100 may be a light-emitting structure having an overall 3D structure. The 3D light-emitting structure 100 may have, for example, a GaN-based light-emitting structure. The 3D light-emitting structure 100 may include a first conductivity type semiconductor layer 110 formed in a 3D shape, an active layer 120 covering a surface of the first conductivity type semiconductor layer 110, and a second conductivity type semiconductor layer 130 covering the active layer 120. The 3D light-emitting structure 100 may be formed by HYPE, MBE, MOVPE, MOCVD, etc.

A mask layer 4 including a plurality of hole or stripe patterns (e.g., patterns) 4H may be provided on the strain-relieving layer 3. The mask layer 4 may include an insulating material. The insulating material may include, for example, a silicon oxide or a silicon nitride. The mask layer 4 may include, for example, $SiO_2$, $TiO_2$, $Si3N_4$, $Al_2O_3$, TiN, AlN, $ZrO_2$, TiAlN, TiSiN, etc. The mask layer 4 may be formed by forming a film made of an insulating material on the strain-relieving layer 3 and then etching the film to form a desired hole or stripe pattern 4H by a lithography process. The hole or stripe pattern 4H may have various cross-section shapes, including a stripe shape, a circular shape, an elliptical shape, a polygonal shape, etc., and the shape of the 3D light-emitting structure 100 may be determined according to a shape, size, of the hole or stripe pattern 4H, a pitch between adjacent hole or stripe patterns 4H, or growth time of the 3D light-emitting structure 100 through the hole or stripe pattern 4H, etc. The "hole or stripe pattern" may be an opening defining a growth area of the 3D light-emitting structure 100. Accordingly, the "hole or stripe pattern" may be referred to as an "opening pattern."

The first conductivity type semiconductor layer 110 may be formed of the same semiconductor material doped with a first conductivity type dopant as the material of the base semiconductor layer 2. For example, the first conductivity type semiconductor layer 110 may be an n-GaN layer. The first conductivity type semiconductor layer 110 may be formed of a different semiconductor material doped with a first conductivity type dopant than the material of the base semiconductor layer 2. For example, the base semiconductor layer 2 may be an n-GaN layer and the first conductivity type semiconductor layer 110 may be an n-InGaN layer. The first conductivity type semiconductor layer 110 may be grown from the strain-relieving layer 3 through the hole or stripe pattern 4H arranged at the mask layer 4. The first conductivity type semiconductor layer 110 may have a cross-section shape including a circular shape, an elliptical shape, a polygonal shape, etc. according to the cross-section shape of the hole or stripe pattern 4H. The first conductivity type semiconductor layer 110 may have a cross-sectional area which tapers off in a growth direction. The first conductivity type semiconductor layer 110 may have at least one semi-polar surface 110S.

The active layer 120 may be a layer emitting light by electron-hole recombination. The active layer 120 may cover a surface of the first conductivity type semiconductor layer 110. The active layer 120 may have a single-quantum-well or multi-quantum-well structure made by adjusting a gap between electronic bands through periodical change of values of x, y, and z in, for example, $Al_xGa_yIn_zN$. For example, the quantum-well structure may be formed by pairing a quantum-well layer with a barrier layer in the form of InGaN/GaN, InGaN/InGaN, InGaN/AlGaN, or InGaN/InAlGaN, and the bandgap energy may be controlled according to a composition ratio of indium (In) in the InGaN layer, thereby adjusting a light emission wavelength band. In general, when the composition ratio of indium (In) is changed by 1%, the light emission wavelength may be shifted by about 5 nm. The active layer 120 may grow radially from the first conductivity type semiconductor layer 110 and cover the surface of the first conductivity type semiconductor layer 110.

The second conductivity type semiconductor layer 130 may cover a surface of the active layer 120. The second conductivity type semiconductor layer 130 may be formed of a semiconductor material doped with a second conductivity type impurity. For example, the second conductivity type semiconductor layer 130 may be a p-GaN layer doped with a p type impurity. Mg, Zn, Be, etc. may be used as the p type impurity.

Figure 4:
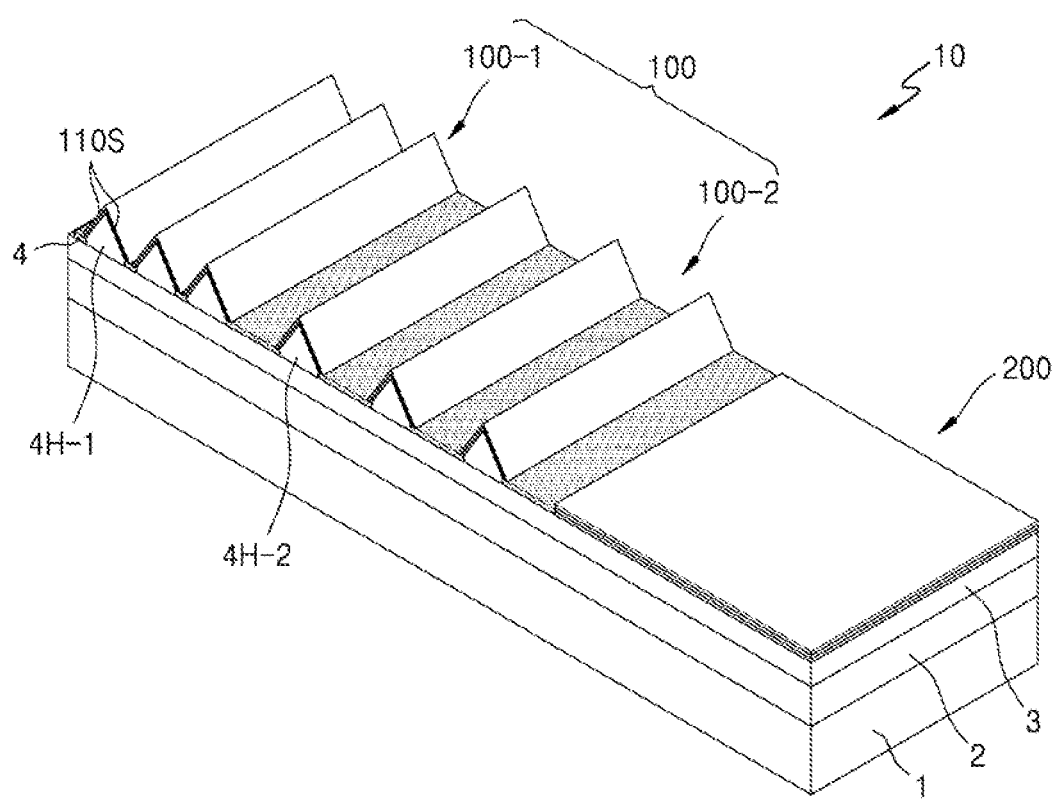
FIG. 4 is a diagram of a 3D light-emitting structure in the shape of a lying trigonal prism.
Figure 5:
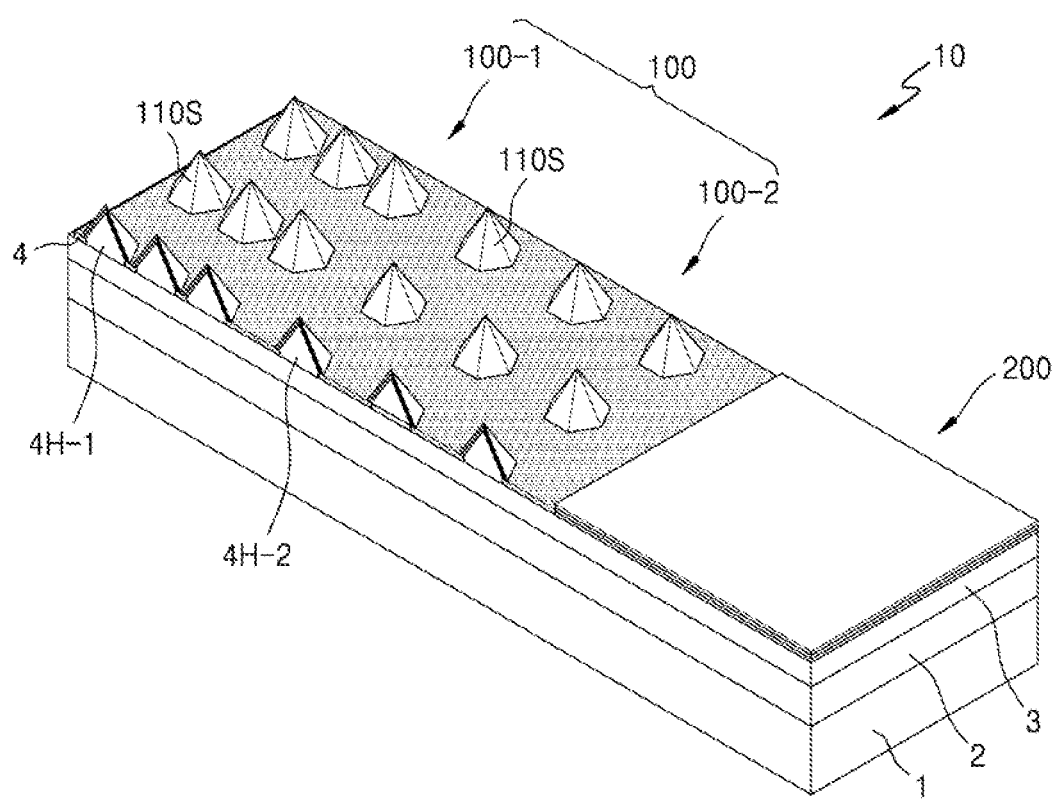
FIG. 5 is a diagram of a 3D light-emitting structure in the shape of a hexagonal pyramid.
Figure 6:
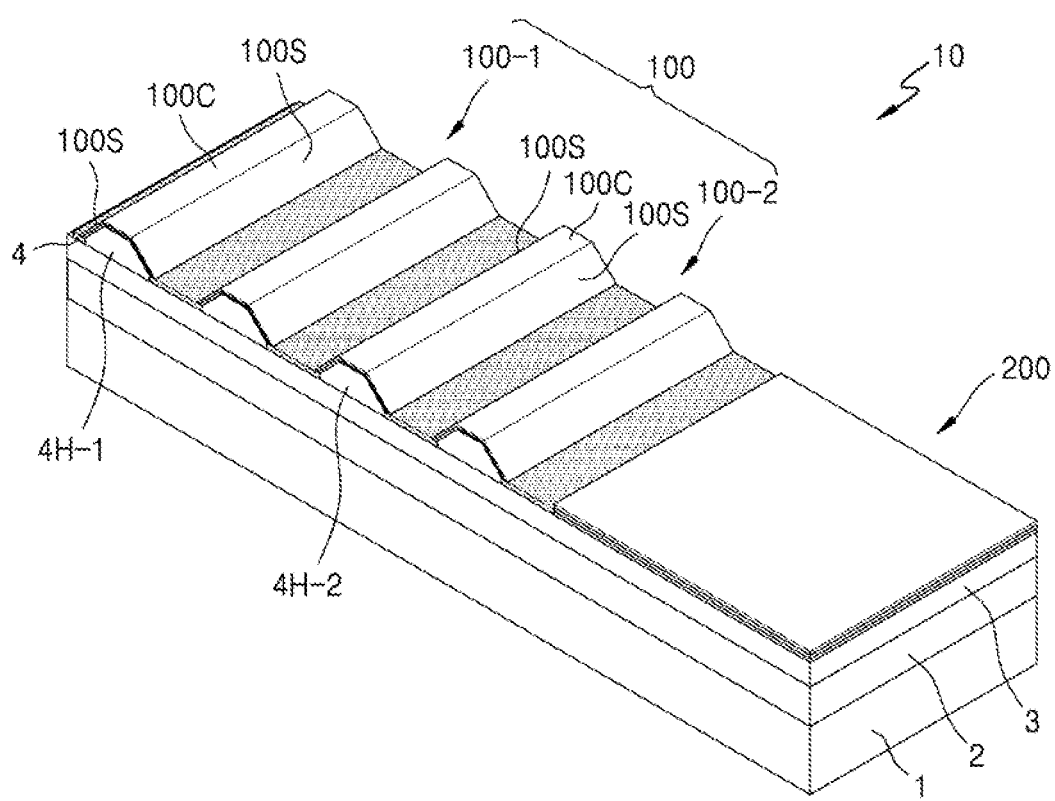
FIG. 6 is a diagram of a 3D light-emitting structure in in the shape of a lying trapezoidal pillar.
Figure 7:
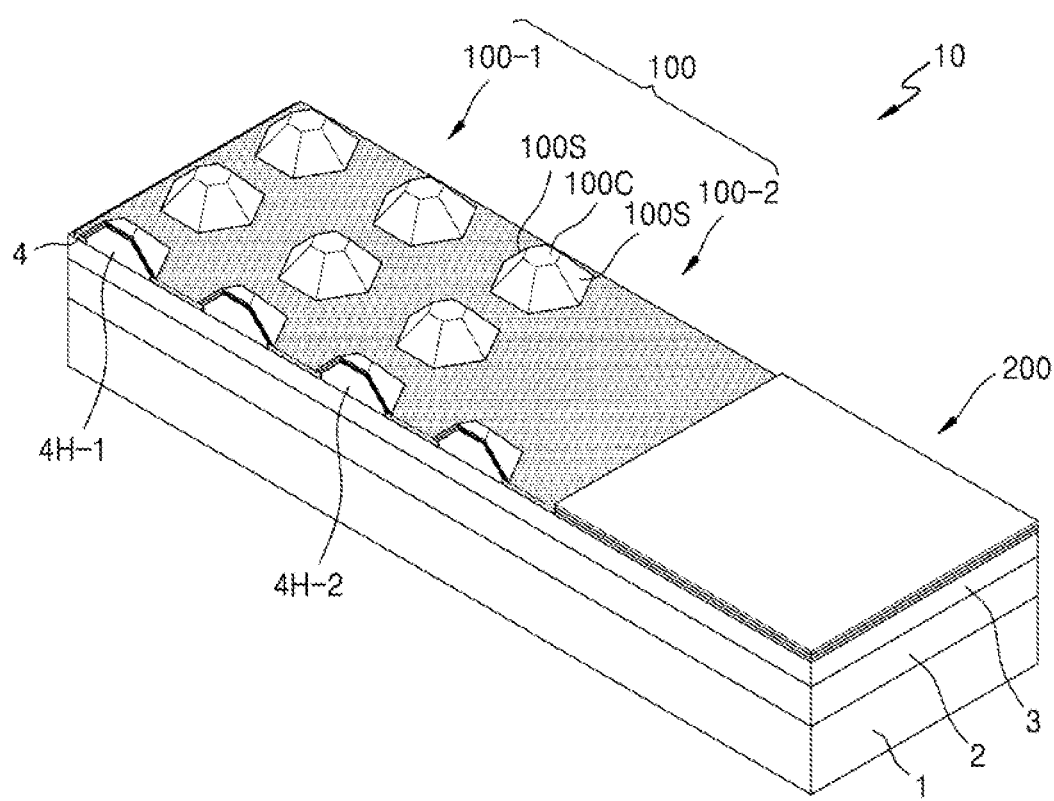
FIG. 7 is a diagram of a 3D light-emitting structure in in the shape of a hexagonal pyramid.

As described above, the 3D shape of the 3D light-emitting structure 100 may be determined according to the shape of the hole or stripe pattern 4H, the size of the hole or stripe pattern 4H, the pitch between adjacent hole or stripe patterns 4H, or growth time of the 3D light-emitting structure 100 through the hole or stripe pattern 4H, etc. FIGS. 4 to 7 illustrate various shapes of the 3D light-emitting structure 100. FIG. 4 is a diagram of the 3D light-emitting structure 100 in the shape of a lying trigonal prism. The 3D light-emitting structure 100 in such shape may be implemented by the hole or stripe pattern 4H having a rectangular stripe shape. The 3D light-emitting structure 100 illustrated in FIG. 4 may have two semi-polar surfaces 100S. FIG. 5 is a diagram of the 3D light-emitting structure 100 in the shape of a hexagonal pyramid. The 3D light-emitting structure 100 in such shape may be implemented by the hole or stripe pattern 4H having a hexagonal shape. The 3D light-emitting structure 100 illustrated in FIG. 5 may have six semi-polar surfaces 100S. FIG. 6 is a diagram of the 3D light-emitting structure 100 in the shape of a lying trapezoidal pillar. The 3D light-emitting structure 100 in such shape may be grown through the hole or stripe pattern 4H having a rectangular stripe shape, and may be implemented by adjusting growth conditions, such as growth time, supply speed of growth material, etc. The 3D light-emitting structure 100 illustrated in FIG. 6 may have two semi-polar surfaces 100S and one polar surface 100C. FIG. 7 is a diagram of the 3D light-emitting structure 100 in the shape of a hexagonal pyramid. The 3D light-emitting structure 100 in such shape may be grown through the hole or stripe pattern 4H having a hexagonal shape, and may be implemented by adjusting growth conditions, such as growth time, supply speed of growth material, etc. The 3D light-emitting structure 100 illustrated in FIG. 7 may have six semi-polar surfaces 100S and one polar surface 100C. The various shapes of the 3D light-emitting structure 100 illustrated in FIGS. 4 to 7 are merely examples, and the 3D light-emitting structure 100 having various shapes according to the shape and growth conditions of the hole or stripe pattern 4H may be implemented.

In the growth process of the 3D light-emitting structure 100, it may be harder to supply nitrogen to the semi-polar surface 110S than a polar surface 110C. For example, when an InGaN layer is grown on the semi-polar surface 110S, as indium (in) or gallium (Ga) is diffused to the semi-polar surface 110S, and the nitrogen supply is insufficient, the growth rate of the InGaN layer to the semi-polar surface 110S may be lowered. The InGaN layer, which has a relatively low indium (In) composition and a relatively thin thickness, may be formed on the semi-polar surface 110S. The indium (In) composition and the thickness of the InGaN layer may be affected by a crystal direction of the semi-polar surface 110S. The crystal direction of the semi-polar surface 110S may be adjusted by a shape of the hole or stripe patterns 4H, a gap (pitch) between the plurality of hole or stripe patterns 4H, growth time, growth speed, etc. For example, when the shape of the hole or stripe pattern 4H and the pitch between the plurality of hole or stripe patterns 4H are controlled, the content and ratio of indium (In) and gallium (Ga) induced during the growth of the light-emitting structure may be changed thermodynamically. Accordingly, the thickness of the InGaN layer and the indium (In) composition in the InGaN layer may be changed, and the light emission wavelength may be adjusted. As such, the light emission wavelength of the 3D light-emitting structure 100 may be adjusted by the combination of the semi-polar surface 110S and the polar surface 110C, adjustment of the crystal direction of the semi-polar surface 110S, etc. Accordingly, the 3D light-emitting structure 100 may include a plurality of light-emitting structures generating light of different wavelengths from each other.

For example, as illustrated in FIG. 1, the 3D light-emitting structure 100 may include a first light-emitting structure 100-1 and a second light-emitting structure 100-2, which generate light of different wavelengths from each other. The second light-emitting structure 100-2 may generate light having a relatively longer wavelength than the first light-emitting structure 100-1. For example, the first light-emitting structure 100-1 may generate blue light, and the second light-emitting structure 100-2 may generate green light. The structure of the first light-emitting structure 100-1 may be similar to the structure of the second light-emitting structure 100-2.

As illustrated in FIG. 3, the first light-emitting structure 100-1 may include a first conductivity type semiconductor layer 110-1 formed in a 3D shape, an active layer 120-1 having a multi-quantum-well structure covering a surface of the first conductivity type semiconductor layer 110-1, and a second conductivity type semiconductor layer 130-1 covering the active layer 120-1. The description regarding the first conductivity type semiconductor layer 110, the active layer 120, and the second conductivity type semiconductor layer 130 may be applied to the first conductivity type semiconductor layer 110-1, the active layer 120-1, and the second conductivity type semiconductor layer 130-1 as well. The first light-emitting structure 100-1 may be grown on the strain-relieving layer 3 through the first hole or stripe pattern 4H-1 provided at the mask layer 4. The shape, light emission wavelength, etc. of the first light-emitting structure 100-1 may be determined by a shape and size of the first hole or stripe pattern 4H-1, a pitch between the plurality of first hole or stripe patterns 4H-1, etc. The "first hole or stripe pattern" may be an opening defining a growth area of the first light-emitting structure 100-1. Accordingly, the "first hole or stripe pattern" may be referred to as a "first opening pattern."

The second light-emitting structure 100-2 may include a first conductivity type semiconductor layer 110-2 formed in a 3D shape, an active layer 120-2 having a multi-quantum-well structure covering a surface of the first conductivity type semiconductor layer 110-2, and a second conductivity type semiconductor layer 130-2 covering the active layer 120-2. The description regarding the first conductivity type semiconductor layer 110, the active layer 120, and the second conductivity type semiconductor layer 130 may be applied to the first conductivity type semiconductor layer 110-2, the active layer 120-2, and the second conductivity type semiconductor layer 130-2 as well. The second light-emitting structure 100-2 may be grown on the strain-relieving layer 3 through the second hole or stripe pattern 4H-2 provided at the mask layer 4. The shape, light emission wavelength, etc. of the second light-emitting structure 100-2 may be determined by a shape and size of the second hole or stripe pattern 4H-2, a pitch between the plurality of second hole or stripe patterns 4H-2, etc. The "second hole or stripe pattern" may be an opening defining a growth area of the second light-emitting structure 100-2. Accordingly, the "second hole or stripe pattern" may be referred to as a "second opening pattern."

The first hole or stripe pattern 4H-1 may be different from the second hole or stripe pattern 4H-2 in at least one of shape, size, and pitch. The indium (In) composition of the first light-emitting structure 100-1 may be less than the indium composition of the second light-emitting structure 100-2. Due to this, the first light-emitting structure 100-1 may generate blue light which has a relatively short wavelength, and the second light-emitting structure 100-2 may generate green light which has a relatively long wavelength. A relatively low indium (In) composition may be implemented by, for example, reducing the pitch between the plurality of first hole or stripe patterns 4H-1 to be lower than the pitch between the plurality of second hole or stripe patterns 4H-2. That is, the pitch between the plurality of second hole or stripe patterns 4H-2 may be greater than the pitch between the plurality of first hole or stripe patterns 4H-1.

The first light-emitting structure 100-1 may have, for example, a plurality of light-emitting structures generating blue light. The active layers 120-1 of the plurality of light-emitting structures forming the first light-emitting structure 100-1 may not be connected to each other; however, this is just an example. The active layers 120-1 of the plurality of light-emitting structures forming the first light-emitting structure 100-1 may be connected to each other. The second light-emitting structure 100-2 may have, for example, a plurality of light-emitting structures generating green light. The active layers 120-2 of the plurality of light-emitting structures forming the second light-emitting structure 100-2 may not be connected to each other; however, this is just an example. The active layers 120-2 of the plurality of light-emitting structures forming the second light-emitting structure 100-2 may be connected to each other.

As described above, as the flat light-emitting structure 200 has the crystal plane in the c axis direction (0001 plane) and is grown on the polar surface, light of single wavelength may be generated, and due to the strong internal magnetic field formed at the crystal plane in the c axis direction (0001 plane), the IQE may decrease. As the bandgap of the flat active layer 220 has a characteristic value, it may be difficult to control the light emission wavelength from the outside. Accordingly, to implement a full color light-emitting device by using a 2D light-emitting structure, phosphor or quantum dots may be used, or blue light-emitting device, green light-emitting device, and red light-emitting device may be required separately. Moreover, to implement a display, the blue light-emitting device, the green light-emitting device, and the red light-emitting device need to be aligned separately on a driving circuit. However, the higher the resolution of the display is, the higher the alignment accuracy is required, and thus, it may be difficult to achieve high productivity and yield in manufacturing the display. To overcome such issues, implementing a full color light-emitting device based on a 3D light-emitting structure including a semi-polar or non-polar crystal surface having no or weak internal electric field may be considered. In the case of 3D light-emitting structure, it is difficult to implement a light-emitting structure having sufficient indium (In) composition to generate red light when growing the light-emitting structure into a 3D structure on a semi-polar crystal surface.

According to the disclosure, the light-emitting device 10 may include both of the 3D light-emitting structure 100 generating light having a relatively short wavelength and the flat light-emitting structure 200 generating light having a relatively long wavelength. The flat light-emitting structure 200 may be grown on the strain-relieving layer 3. According to such configuration, blue light and green light, which have a relatively short wavelength, may be generated by the 3D light-emitting structure 100. In addition, as the strain in the process of growing the flat light-emitting structure 200 is relieved by the strain-relieving layer 3, the IQE of the flat light-emitting structure 200 may be increased, and as the indium (In) composition in the flat light-emitting structure 200 is increased, the flat light-emitting structure 200 having a high light emission efficiency in the red light range where implementing a 3D light-emitting structure is difficult may be implemented. Accordingly, the light-emitting device 10 with high light emission efficiency may be implemented. According to a display to which the light-emitting device 10 of the disclosure is applied, costs, time, etc. required for manufacturing of the display may be reduced, compared to the case where each of blue/green/red light-emitting devices is aligned on a driving circuit, and thus, high efficiency and yield in production of the display may be achieved. Moreover, a high resolution display manufactured with high productivity and yield may be implemented.

Figure 8:
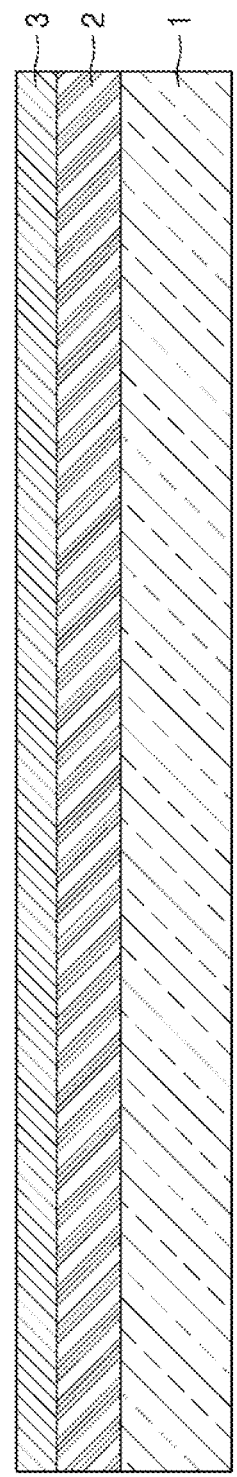
FIGS. 8 and 9 are diagrams showing an embodiment of a method of manufacturing a light-emitting device.
Figure 9:
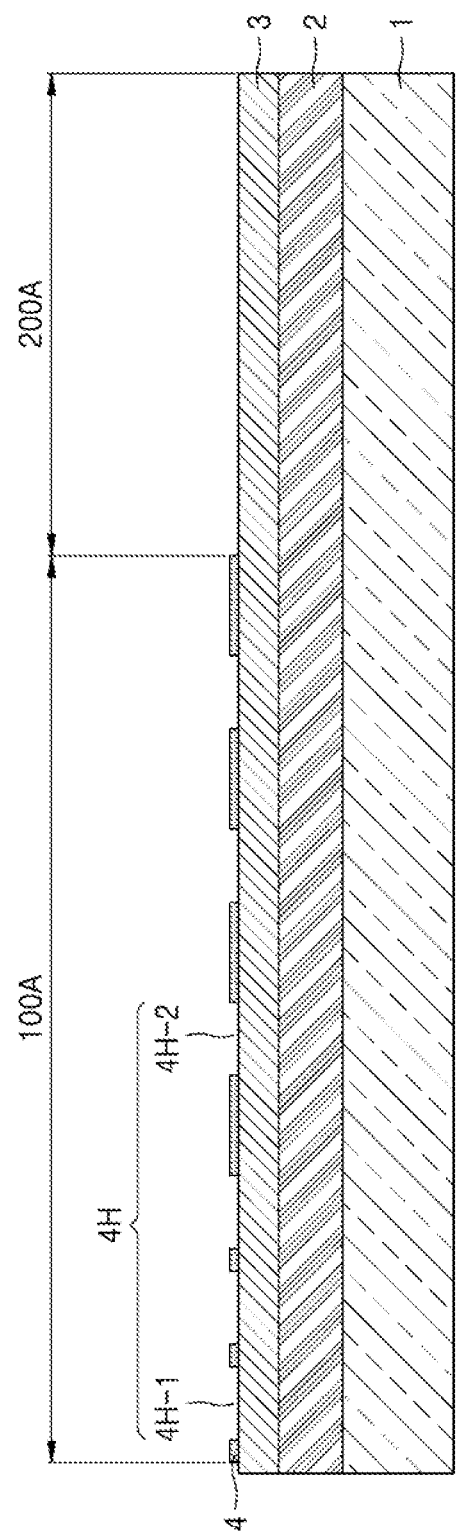

FIGS. 8 and 9 are diagrams showing an embodiment of a method of manufacturing the light-emitting device 10. First, with reference to FIG. 8, each of the base semiconductor layer 2 and the strain-relieving layer 3 may be formed on the substrate 1. A substrate 1 may be a growth substrate for semiconductor single crystal growth, and a silicon (Si) substrate, a silicon carbide (SiC) substrate, a sapphire substrate, etc. may be used. In addition, a material suitable for growth of the base semiconductor layer 2 to be formed on the substrate 1, for example, AlN, AlGaN, ZnO, GaAs, $MgAl_2O_4$, MgO, $LiAlO_2$, $LiGaO_2$, GaN, etc. may be used in the substrate 1.

The base semiconductor layer 2 may be formed on the substrate 1. After growing a group III-V nitride semiconductor material, such as GaN on the substrate 1, by doping the same with an n type impurity, for example, Si, Ge, Se, Te, etc., an n-GaN layer may be formed. The base semiconductor layer 2 may be formed by HVPE, MBE, MOVPE, MOCVD, etc. A buffer layer required for epitaxy growth may be further formed between the substrate 1 and the base semiconductor layer 2, when necessary.

The strain-relieving layer 3 may be formed on the base semiconductor layer 2. The strain-relieving layer 3 may include, for example, a material having a middle lattice size between a lattice size of the base semiconductor layer 2 and a lattice size of the flat light-emitting structure 200. For example, in a GaN-based flat semiconductor structure 200, the strain-relieving layer 3 may have a single-layer or multi-layer structure including, for example, an InGaN layer. The strain-relieving layer 3 may include a superlattice layer. When GaN is employed as the base semiconductor layer 2, and the flat light-emitting structure 200 is a GaN-based light-emitting structure, the strain-relieving layer 3 may have a single-layer structure or a multi-layer structure which includes an InGaN-superlattice layer. The strain-relieving layer 3 may be formed by HVPE, MBE, MOVPE, MOCVD, etc. The strain-relieving layer 3 may be formed in an area in which at least the flat light-emitting structure 200 on the base semiconductor layer 2 is to be formed. In the embodiment, the strain-relieving layer 3 may be entirely formed on the base semiconductor layer 2 including the area in which the 3D light-emitting structure 100 on the base semiconductor layer 2 is to be formed.

Then, with reference to FIG. 9, the mask layer 4 may be formed on the strain-relieving layer 3. The mask layer 4 may define an area 100A in which the 3D light-emitting structure 100 is to be formed and an area 200A in which the flat light-emitting structure 200 is to be formed. The mask layer 4 may have a plurality of hole or stripe patterns (e.g., patterns) 4H in the area 100A. The upper surface of the strain-relieving layer 3 may be exposed by the plurality of hole or stripe patterns 4H. The mask layer 4 may be formed of, for example, $SiO_2$, $TiO_2$, $Si_3N_4$, $Al_2O_3$, TiN, AlN, $ZrO_2$, TiAlN, TiSiN, etc. The mask layer 4 may be formed by forming a film made of an insulating material on the strain-relieving layer 3 and then etching the film to form a desired hole or stripe pattern by the lithography process. The hole or stripe pattern 4H may have various cross-section shapes, including, a stripe shape, a circular shape, an elliptical shape, a polygonal shape, etc., and the shape, light emission wavelength, etc. of the 3D light-emitting structure 100 may be determined according to a shape, size, of the hole or stripe pattern 4H, a pitch between adjacent hole or stripe patterns 4H, growth time of the 3D light-emitting structure 100, etc. The plurality of hole or stripe patterns 4H may include, for example, a plurality of first hole or stripe patterns (e.g., first patterns) 4H-1 and a plurality of second hole or stripe patterns (e.g., second patterns) 4H-2 in which a first light-emitting structure 100-1 and a second light-emitting structure 100-2 are to be grown, respectively. The plurality of first hole or stripe patterns 4H-1 may be different from the plurality of second hole or stripe patterns 4H-2 in at least one of shape, size, and gap. The shape, size, and gap of the plurality of first hole or stripe patterns 4H-1 and the plurality of second hole or stripe patterns 4H-2 may be determined in consideration of a light emission wavelength of the first light-emitting structure 100-1 and the second light-emitting structure 100-2. For example, the first light-emitting structure 100-1 may generate blue light which has a relatively short wavelength, and the second light-emitting structure 100-2 may generate green light which has a relatively long wavelength. In such case, a gap between the plurality of second hole or stripe patterns 4H-2 may be smaller than a gap between the plurality of first hole or stripe patterns 4H-1. The indium (In) composition of the first light-emitting structure 100-1 grown in the plurality of first hole or stripe patterns 4H-1 may be less than the indium (In) composition of the second light-emitting structure 100-2 grown in the plurality of second hole or stripe patterns 4H-2.

The 3D light-emitting structure 100 and the flat light-emitting structure 200 may be respectively formed in the area 100A and the area 200A on the strain-relieving layer 3. The 3D light-emitting structure 100 and the flat light-emitting structure 200 may be formed simultaneously or sequentially. The 3D light-emitting structure 100 and the flat light-emitting structure 200 may be formed by HYPE, MBE, MOVPE, MOCVD, etc.

The first conductivity type semiconductor layer 110-1 and 110-2 may be grown in a 3D shape on the strain-relieving layer 3 through the plurality of first hole or stripe patterns 4H-1 and the plurality of second hole or stripe patterns 4H-2 of the mask layer 4. The first conductivity type semiconductor layer 110-1 and 110-2 may be, for example, an n-GaN layer, or an n-InGaN layer. In an embodiment, the first conductivity type semiconductor layer 110-1 and 110-2 may be an n-GaN layer. The first conductivity type semiconductor layer 110-1 and 110-2 may have at least one semi-polar surfaces 100S. The first conductivity type semiconductor layer 110-1 and 110-2 may have the polar surface 100C. The active layer 120-1 and 120-2 may be grown on the first conductivity type semiconductor layer 110-1 and 110-2, respectively, and cover the first conductivity type semiconductor layer 110-1 and 110-2, respectively. The active layer 120-1 and 120-2 may have a single-quantum-well or multi-quantum-well structure. The quantum-well layer and the barrier layer may be paired in the form of InGaN/GaN, InGaN/InGaN, InGaN/AlGaN, or InGaN/InAlGaN to form the quantum-well structure. By the shape, size, pitch, etc. of the plurality of first hole or stripe patterns 4H-1 and the plurality of second hole or stripe patterns 4H-2, the composition ration of indium (In) in the InGaN layer may be changed, and the light emission wavelength of the first light-emitting structure 100-1 and the second light-emitting structure 100-2 may be determined. The second conductivity type semiconductor layer 130-1 and 130-2 may be grown on the active layer 120-1 and 120-2, respectively, and cover the active layer 120-1 and 120-2, respectively. For example, the second conductivity type semiconductor layer 130 may be a p-GaN layer.

The flat light-emitting structure 200 may be formed in the area 200A on the strain-relieving layer 3. The first conductivity type flat semiconductor layer 210 may be, for example, an n-GaN layer, or an n-InGaN layer. In an embodiment, as the first conductivity type semiconductor layer 110-1 and 110-2 and the first conductivity type flat semiconductor layer 210 are grown simultaneously, the first conductivity type flat semiconductor layer 210 may be formed of the same material as the material of the first conductivity type semiconductor layer 110-1 and 110-2. In an embodiment, the first conductivity type flat semiconductor layer 210 may be an n-GaN layer. The composition ratio of a material forming the first conductivity type flat semiconductor layer 210 may be different from that of the first conductivity type semiconductor layer 110-1 and 110-2. The flat active layer 220 may be grown on the polar surface on the first conductivity type flat semiconductor layer 210 and cover the first conductivity type flat semiconductor layer 210. The flat active layer 220 may have a single-quantum-well or multi-quantum-well structure. The quantum-well layer and the barrier layer may be paired in the form of InGaN/GaN, InGaN/InGaN, InGaN/AlGaN, or InGaN/InAlGaN to form the quantum-well structure. In an embodiment, as the active layer 120-1 and 120-2 and the flat active layer 220 are grown simultaneously, the flat active layer 220 may include the same material as the material of the active layer 120-1 and 120-2. However, the composition ratio of a material forming the flat active layer 220 may be different from that of the active layer 120-1 and 120-2. The second conductivity type flat semiconductor layer 230 may be grown on the flat active layer 220 and cover the surface of the flat active layer 220. In an embodiment, as the second conductivity type semiconductor layer 130-1 and 130-2 and the second conductivity type flat semiconductor layer 230 are grown simultaneously, the second conductivity type flat semiconductor layer 230 may include the same material as the material of the second conductivity type semiconductor layer 130-1 and 130-2. The composition ratio of a material forming the second conductivity type flat semiconductor layer 230 may be different from that of the second conductivity type semiconductor layer 130-1 and 130-2. In an embodiment, the second conductivity type flat semiconductor layer 230 may be a p-GaN layer.

By the aforementioned process, the monolithic light-emitting device 10 capable of emitting full color light illustrated in FIGS. 1 to 7 may be manufactured.

The strain-relieving layer 3 may relieve the lattice mismatch between the lower structure, e.g., the base semiconductor layer 2 and the upper structure, e.g., the flat active layer 220 and strain of the growth process due to the lattice mismatch. The 3D light-emitting structure 100 may need the first conductivity type semiconductor layer 110 to facilitate the electron injection. In an embodiment, as the 3D light-emitting structure 100 and the flat light-emitting structure 200 are grown simultaneously, the first conductivity type flat semiconductor layer 210 may be grown in the area 200A on the strain-relieving layer 3. As the size of the area 200A is relatively greater than the size of the hole or stripe pattern 4H, the amount of growth source supplied to the area 200A may be relatively small, and the thickness of the first conductivity type flat semiconductor layer 210 may be very thin. Accordingly, the function and effect of the strain-relieving layer 3 arranged between the flat active layer 220 and the base semiconductor layer 2 may be hardly affected. Accordingly, the function and effect of the strain-relieving layer 3 may be maintained while the electron is injected into the 3D light-emitting structure 100.

The strain-relieving layer 3 may function as a lattice matching layer. As a lattice constant of GaN forming the base semiconductor layer 2 is less than a lattice constant of InGaN forming the flat active layer 220, when an InGaN layer is grown on a GaN layer, the inflow rate of indium (In) may be limited, and thus, it may be difficult to increase the composition of indium (In) in the flat active layer 220. By growing the flat light-emitting structure 200 on the strain-relieving layer 3, the strain due to the lattice mismatch may be relieved, which allows sufficient indium (In) inflow to the flat light-emitting structure 200, and the indium (In) composition of the flat light-emitting structure 200 may be increased. The flat light-emitting structure 200 may be a GaN-based semiconductor compound and may be grown on the polar surface. Polarization due to the piezoelectric field effect may occur structurally when a GaN-based semiconductor compound is grown on a polar surface, which leads to QCSE and reduced IQE. When the strain is relieved by the strain-relieving layer 3 in the growth process, the polarization due to the piezoelectric field effect may be inhibited, and the reduction of IQE may also be suppressed.

The strain-relieving layer 3 may reduce internal defects of the flat active layer 220 due to the lattice mismatch. As a lattice constant of GaN forming the base semiconductor layer 2 is less than a lattice constant of InGaN forming the flat active layer 220, when an InGaN layer is grown on a GaN layer while increasing the composition of indium (In), crystal defects may be generated in the flat active layer 220. The crystal defect may cause decrease in IQE. By applying the strain-relieving layer 3, the indium (In) composition may be increased with little crystal defect. In addition, the decrease in IQE due to the crystal defects may be inhibited.

The strain-relieving layer 3 may have the effect of relieving the lattice mismatch and strain, and thus, induce increase in the indium (In) composition, decrease in crystal defects, and improvement of IQE in the process growing the light-emitting structure. Such effects of the strain-relieving layer 3 may also be applied to the 3D light-emitting structure 100 grown on a semi-polar surface. Accordingly, the indium (In) composition in the 3D light-emitting structure 100 may be effectively controlled to generate light of desired wavelength, and the IQE may also be increased.

Figure 10:
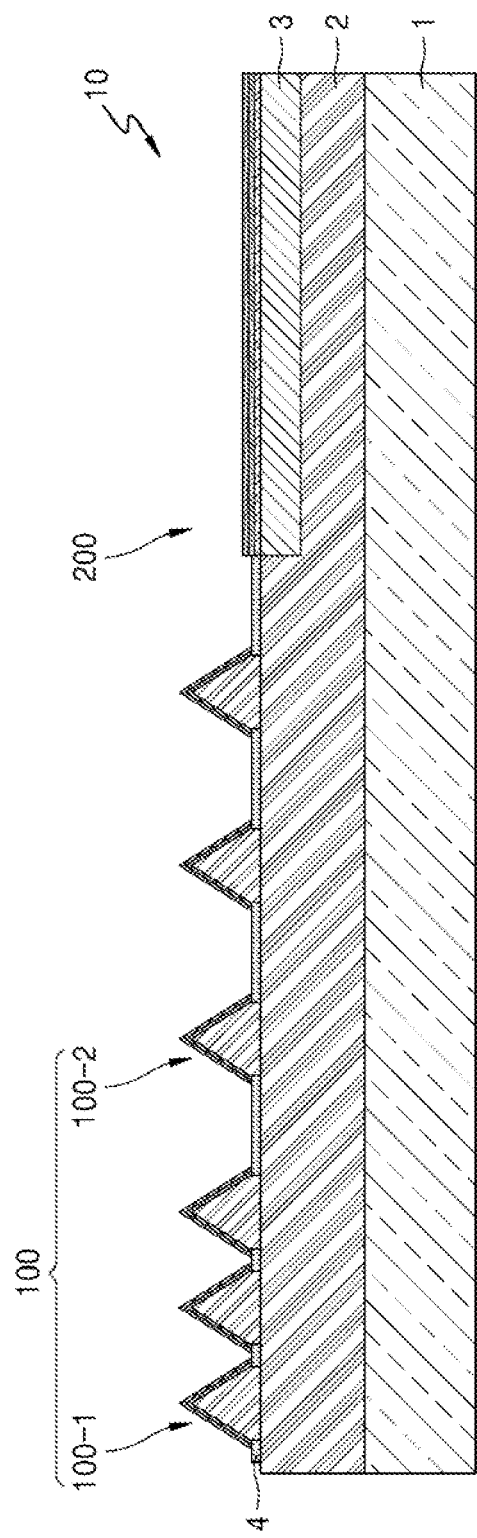
FIG. 10 is a cross-sectional view of a schematic structure of a light-emitting device according to an embodiment.

FIG. 10 is a cross-sectional view of a schematic structure of the light-emitting device 10 according to an embodiment. With reference to FIG. 10, the light-emitting device 10 of the embodiment is different from the embodiment illustrated in FIGS. 1 to 7 in that, in FIG. 10, the strain-relieving layer 3 is formed only between the base semiconductor layer 2 and the flat light-emitting structure 200. With reference to FIG. 10, the 3D light-emitting structure 100 may be grown on the base semiconductor layer 2 and the flat light-emitting structure 200 may be grown on the strain-relieving layer 3. An upper surface of the base semiconductor layer 2 may be formed in a stepped manner. The upper surface of the base semiconductor layer 2 may have a recessed portion in an area in which the flat light-emitting structure 200 is to be formed. The strain-relieving layer 3 may be formed in the recessed portion. An upper surface of an area of the base semiconductor layer 2, in which the 3D light-emitting structure 100 is formed, may have the same height as an upper surface of the strain-relieving layer 3. For example, the area of the upper surface of the base semiconductor layer 2, in which the flat light-emitting structure 200 is to be formed, e.g., an area 200A of FIG. 9 may be etched to form the recessed portion, which is concavely stepped, and the strain-relieving layer 3 may be selectively grown in the recessed portion.

Figure 11:
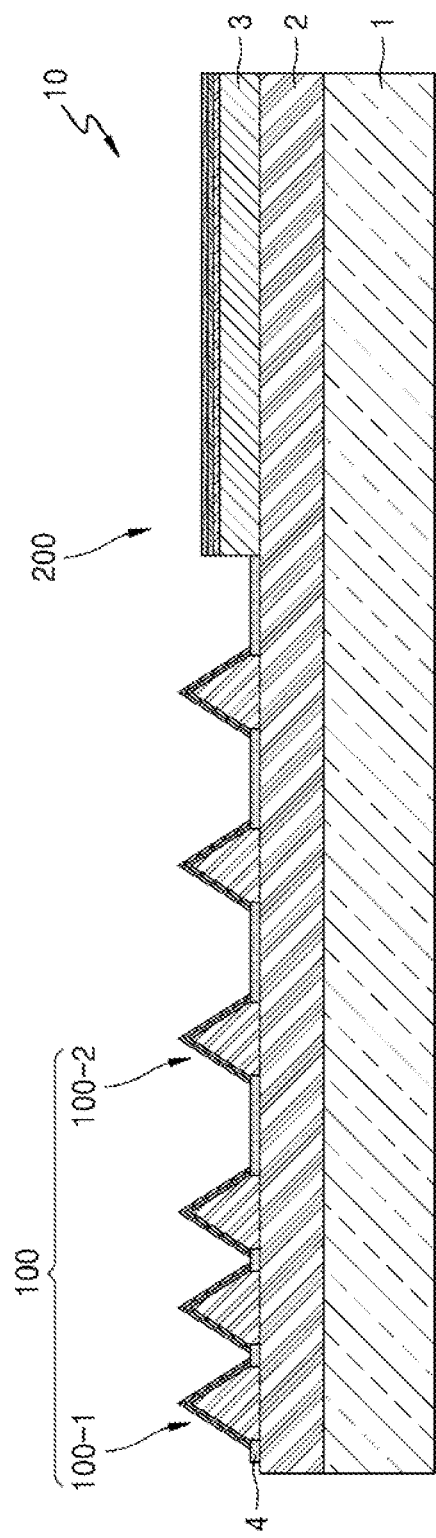
FIG. 11 is a cross-sectional view of a schematic structure of a light-emitting device according to an embodiment.

FIG. 11 is a cross-sectional view of a schematic structure of the light-emitting device 10 according to an embodiment. The light-emitting device 10 of FIG. 11 is different from the embodiment illustrated in FIG. 10 in that, in FIG. 11, the surface of the strain-relieving layer 3 and the surface of the base semiconductor layer 2 are arranged in a stepped manner.

Various examples of an electronic device to which the embodiments of the light-emitting device 10 are applied are described below. The electronic device may be a display, or various devices including a display.

Figure 12:
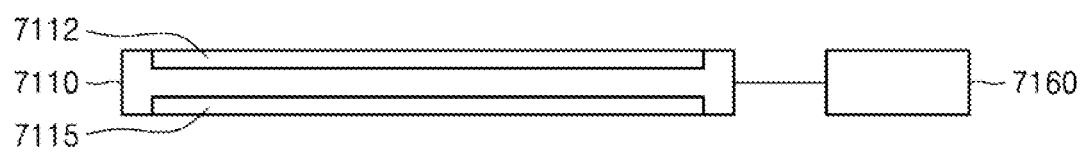
FIG. 12 is a schematic view of an embodiment of a display.

FIG. 12 is a schematic view of an embodiment of a display. With reference to FIG. 12, the display may include a display panel 7110 and a controller 7160. The display panel 7110 may include a light-emitting structure 7112 and a driving circuit 7115 switching on and off the light-emitting structure 7112. The light-emitting structure 7112 may include a plurality of light-emitting devices 10 described with reference to FIGS. 1 to 11. The plurality of light-emitting devices 10 may be arranged in a 2D array. The driving circuit 7115 may include a plurality of switching devices configured to respectively switch on and off the plurality of light-emitting devices 10. The controller 7160 may input an on-off switching signal of the plurality of light-emitting devices 10 to the driving circuit 7115 according to an image signal.

Figure 13:
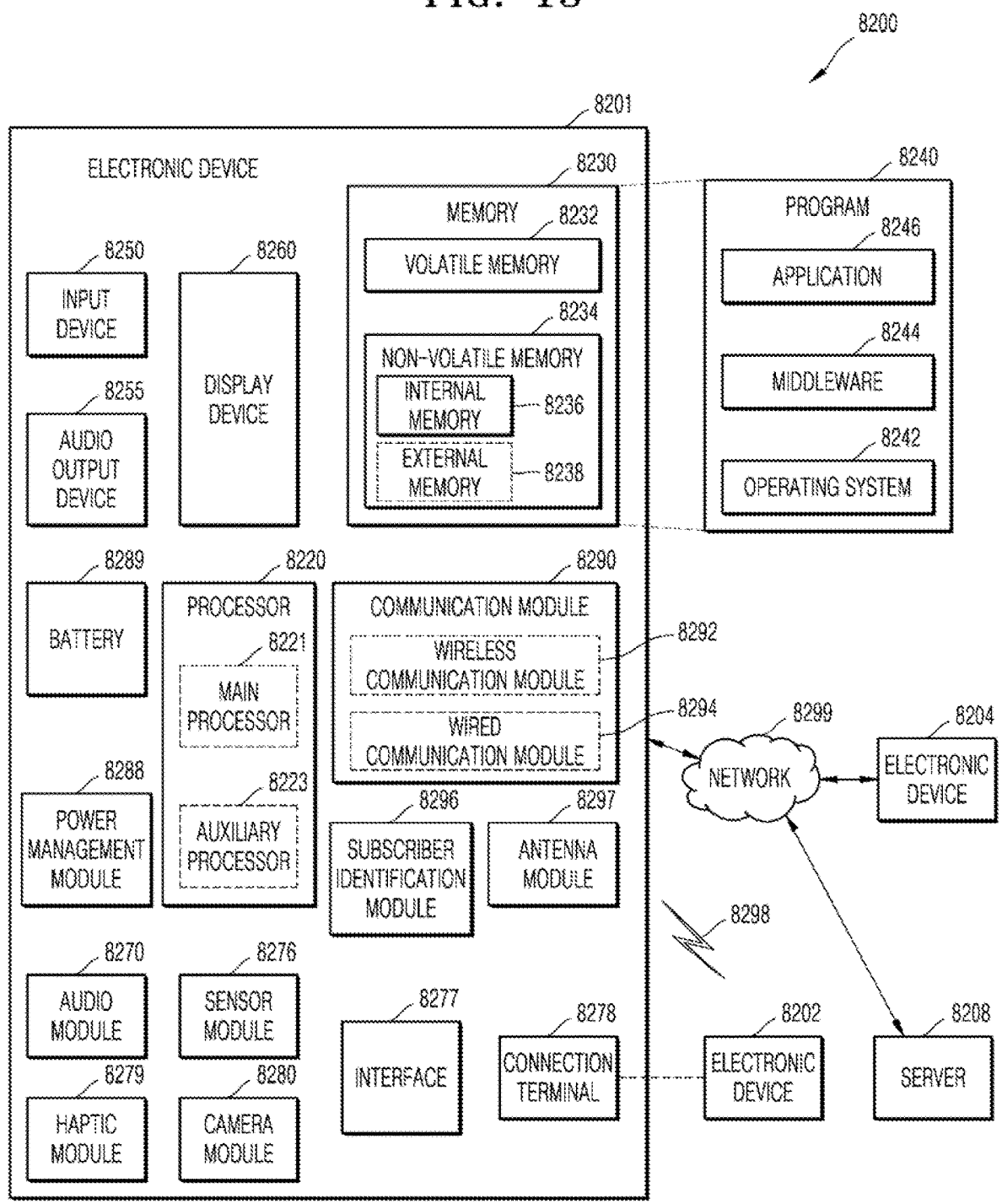
FIG. 13 is a block diagram of an electronic device including a display.

FIG. 13 is a block diagram of an electronic device including a display. With reference to FIG. 13, an electronic device 8201 may be provided in a network environment 8200. In the network environment 8200, the electronic device 8201 may communicate with another electronic device 8202 through a first network 8298 (a short-range wireless communication network, etc.) or communicate with another electronic device 8204 and/or a server 8208 through a second network 8299 (a long-distance wireless communication network, etc.). The electronic device 8201 may communicate with the electronic device 8204 through the server 8208. The electronic device 8201 may include a processor 8220, a memory 8230, an input device 8250, an audio output device 8255, a display device 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. In the electronic device 8201, some of constituent elements may be omitted or other constituent elements may be added. Some of the constituent elements may be implemented by one integrated circuit. For example, the sensor module 8276 (a fingerprint sensor, an iris sensor, an illuminance sensor, and the like) may be implemented by being embedded in the display device 8260 (a display, and the like).

The processor 8220 may control one or a plurality of other constituent elements (hardware and software constituent elements, and the like) of the electronic device 8201 connected to the processor 8220 by executing software (a program 8240, and the like), and perform various data processing or calculations. As a part of the data processing or calculations, the processor 8220 may load, in a volatile memory 8232, commands and/or data received from other constituent elements (the sensor module 8276, the communication module 8290, and the like), process the command and/or data stored in the volatile memory 8232, and store result data in a non-volatile memory 8234 including an internal memory 8236 and/or an external memory 8238. The processor 8220 may include a main processor 8221 (a central processing unit, an application processor, and the like) and an auxiliary processor 8223 (a graphics processing unit, an image signal processor, a sensor hub processor, a communication processor, and the like) that is operable independently of or together with the main processor 8221. The auxiliary processor 8223 may use less power than the main processor 8221 and may perform a specialized function.

Instead of the main processor 8221 when the main processor 8221 is in an inactive state (sleep state), or with the main processor 8221 when the main processor 8221 is in an active state (application execution state), the auxiliary processor 8223 may control functions and/or states related to some constituent elements (the display device 8260, the sensor module 8276, the communication module 8290, and the like) of the constituent elements of the electronic device 8201. The auxiliary processor 8223 (an image signal processor, a communication processor, and the like) may be implemented as a part of functionally related other constituent elements (the camera module 8280, the communication module 8290, and the like).

The memory 8230 may store various data needed by the constituent elements (the processor 8220, the sensor module 8276, and the like) of the electronic device 8201. The data may include, for example, software (the program 8240, and the like) and input data and/or output data about commands related thereto. The memory 8230 may include the volatile memory 8232 and/or the non-volatile memory 8234.

The program 8240 may be stored in the memory 8230 as software, and may include an operating system 8242, middleware 8244, and/or an application 8246.

The input device 8250 may receive commands and/or data to be used for constituent elements (the processor 8220, and the like) of the electronic device 8201, from the outside (a user, and the like) of the electronic device 8201. The input device 8250 may include a remote controller, a microphone, a mouse, a keyboard, and/or a digital pen (a stylus pen, and the like).

The audio output device 8255 may output an audio signal to the outside of the electronic device 8201. The audio output device 8255 may include a speaker and/or a receiver. The speaker may be used for general purposes such as multimedia playback or recording playback, and the receiver can be used to receive incoming calls. The receiver may be implemented by being coupled as a part of the speaker or by an independent separate device.

The display device 8260 may visually provide information to the outside of the electronic device 8201. The display device 8260 may include a display, a hologram device, or a projector, and a control circuit to control a corresponding device. The display device 8260 may include the display described with reference to FIG. 12. The display device 8260 may include the light-emitting device 10 described with reference to FIGS. 1 to 11. The display device 8260 may include a touch circuitry set to detect a touch and/or a sensor circuit (a pressure sensor, and the like) set to measure the strength of a force generated by the touch.

The audio module 8270 may convert sound into electrical signals or reversely electrical signals into sound. The audio module 8270 may obtain sound through the input device 8250, or output sound through a speaker and/or a headphone of another electronic device (the electronic device 8202, and the like) connected to the audio output device 8255 and/or the electronic device 8201 in a wired or wireless manner.

The sensor module 8276 may detect an operation state (power, temperature, and the like) of the electronic device 8201, or an external environment state (a user state, and the like), and generate an electrical signal and/or a data value corresponding to a detected state. The sensor module 8276 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more specified protocols used for the electronic device 8201 to be connected to another electronic device (the electronic device 8202, and the like) in a wired or wireless manner. The interface 8277 may include a high definition multimedia interface (HDMI), a universal serial bus (USB) interface, an SD card interface, and/or an audio interface.

A connection terminal 8278 may include a connector for the electronic device 8201 to be physically connected to another electronic device (the electronic device 8202, and the like). The connection terminal 8278 may include an HDMI connector, a USB connector, an SD card connector, and/or an audio connector (a headphone connector, and the like).

The haptic module 8279 may convert electrical signals into mechanical stimuli (vibrations, movements, and the like) or electrical stimuli that are perceivable by a user through tactile or motor sensations. The haptic module 8279 may include a motor, a piezoelectric device, and/or an electrical stimulation device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject for image capturing.

The power management module 8288 may manage power supplied to the electronic device 8201. The power management module 8288 may be implemented as a part of a power management integrated circuit (PMIC).

The battery 8289 may supply power to the constituent elements of the electronic device 8201. The battery 8289 may include non-rechargeable primary cells, rechargeable secondary cells, and/or fuel cells.

The communication module 8290 may establish a wired communication channel and/or a wireless communication channel between the electronic device 8201 and another electronic device (the electronic device 8202, the electronic device 8204, the server 8208, and the like), and support a communication through an established communication channel. The communication module 8290 may be operated independent of the processor 8220 (the application processor, and the like), and may include one or more communication processors supporting a wired communication and/or a wireless communication. The communication module 8290 may include a wireless communication module 8292 (a cellular communication module, a short-range wireless communication module, a global navigation satellite system (GNSS) communication module, and the like), and/or a wired communication module 8294 (a local area network (LAN) communication module, a power line communication module, and the like). Among the above communication modules, a corresponding communication module may communicate with another electronic device through the first network 8298 (a short-range communication network such as Bluetooth, WiFi Direct, or infrared data association (IrDA)) or the second network 8299 (a long-range communication network such as a cellular network, the Internet, or a computer network (LAN, WAN, and the like)). These various types of communication modules may be integrated into one constituent element (a single chip, and the like), or may be implemented as a plurality of separate constituent elements (multiple chips). The wireless communication module 8292 may verify and authenticate the electronic device 8201 in a communication network such as the first network 8298 and/or the second network 8299 by using subscriber information (an international mobile subscriber identifier (IMSI), and the like) stored in the subscriber identification module 8296.

The antenna module 8297 may transmit signals and/or power to the outside (another electronic device, and the like) or receive signals and/or power from the outside. An antenna may include an emitter formed in a conductive pattern on a substrate (a printed circuit board (PCB), and the like). The antenna module 8297 may include one or a plurality of antennas. When the antenna module 8297 includes a plurality of antennas, the communication module 8290 may select, from among the antennas, an appropriate antenna for a communication method used in a communication network such as the first network 8298 and/or the second network 8299. Signals and/or power may be transmitted or received between the communication module 8290 and another electronic device through the selected antenna. Other parts (an RFIC, and the like) than the antenna may be included as a part of the antenna module 8297.

Some of the constituent elements may be connected to each other through a communication method between peripheral devices (a bus, general purpose input and output (GPIO), a serial peripheral interface (SPI), a mobile industry processor interface (MIPI), and the like) and may mutually exchange signals (commands, data, and the like).

The command or data may be transmitted or received between the electronic device 8201 and the external electronic device 8204 through the server 8208 connected to the second network 8299. The electronic devices 8202 and 8204 may be of a type that is the same as or different from the electronic device 8201. All or a part of operations executed in the electronic device 8201 may be executed in one or more electronic devices (8202, 8204, and 8208). For example, when the electronic device 8201 needs to perform a function or service, the electronic device 8201 may request one or more electronic devices to perform part of the whole of the function or service, instead of performing the function or service. The one or more electronic devices receiving the request may perform additional function or service related to the request, and transmit a result of the performance to the electronic device 8201. To this end, cloud computing, distributed computing, and/or client-server computing technology may be used.

The electronic device 8201 may be applied to various devices. Various components of the electronic device 8201 described above may be properly changed according to functions of the device, and other proper components may be added to perform the functions of the device. Hereinafter, example applications of the electronic device 8201 are described.

Figure 14:
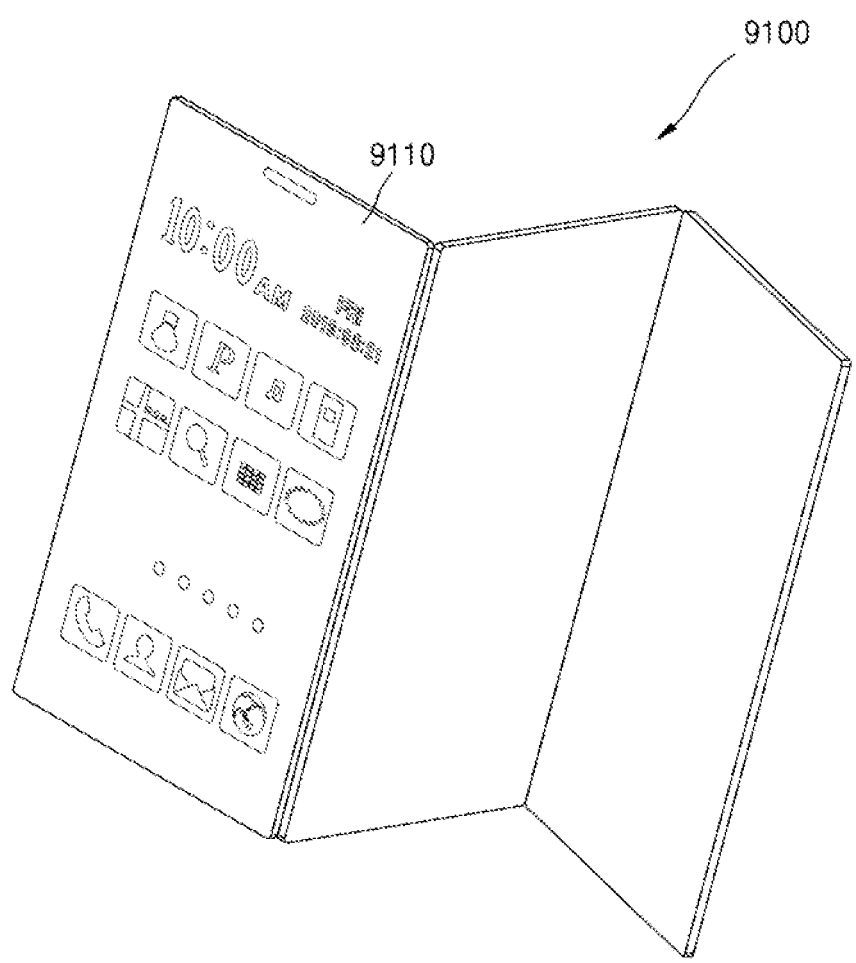
FIG. 14 is a diagram of an embodiment of a mobile device as an application example of an electronic device.

FIG. 14 is a diagram of an embodiment of a mobile device as an application example of an electronic device. A mobile device 9100 may include a display device 9110. The display device 9110 may include the display described with reference to FIG. 12. The display device 9110 may include at least one of the light-emitting device 10 described with reference to FIGS. 1 to 11. The display device 9110 may have a foldable structure, for example, a multi-foldable structure.

Figure 15:
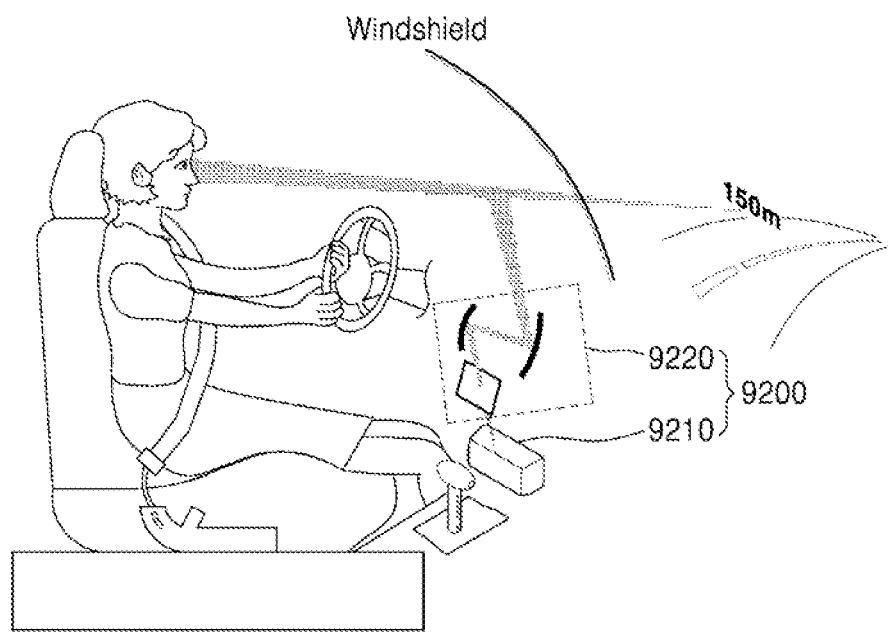
FIG. 15 is a diagram of an embodiment of a head-up display device for a vehicle as an application example of an electronic device.

FIG. 15 is a diagram of an embodiment of a head-up display device for vehicle as an application example of an electronic device. A head-up display device for vehicle 9200 may include a display device 9210 provided in an area of a vehicle and an optical path change member 9220 configured to change an optical path so that a driver can see an image generated at the display device 9210. The display device 9210 may include the display described with reference to FIG. 12. The display device 9210 may include at least one of the light-emitting device 10 described with reference to FIGS. 1 to 11.

Figure 16:
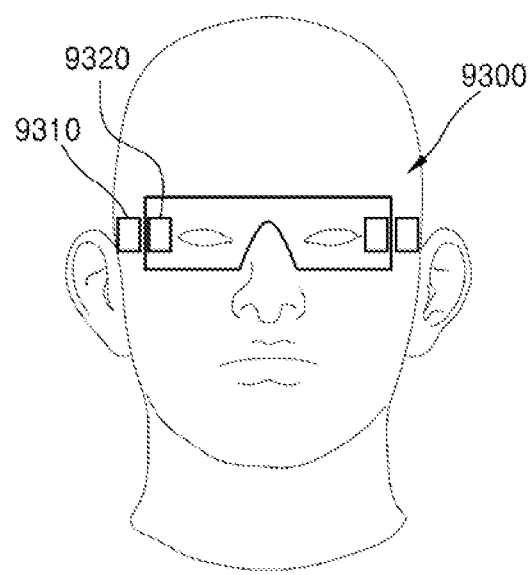
FIG. 16 is a diagram illustrating an embodiment of augmented-reality glasses or virtual-reality glasses as an application example of an electronic device.

FIG. 16 is a diagram illustrating an embodiment of augmented-reality glasses or virtual-reality glasses as an application example of an electronic device. The augmented-reality glasses (or virtual-reality glasses) 9300 may include a projection system 9310 configured to form an image and an element 9320 configured to guide the image from the projection system 9310 to user's eyes. The projection system 9310 may include the display described with reference to FIG. 12. The projection system 9310 may include at least one of the light-emitting device 10 described with reference to FIGS. 1 to 11.

Figure 17:
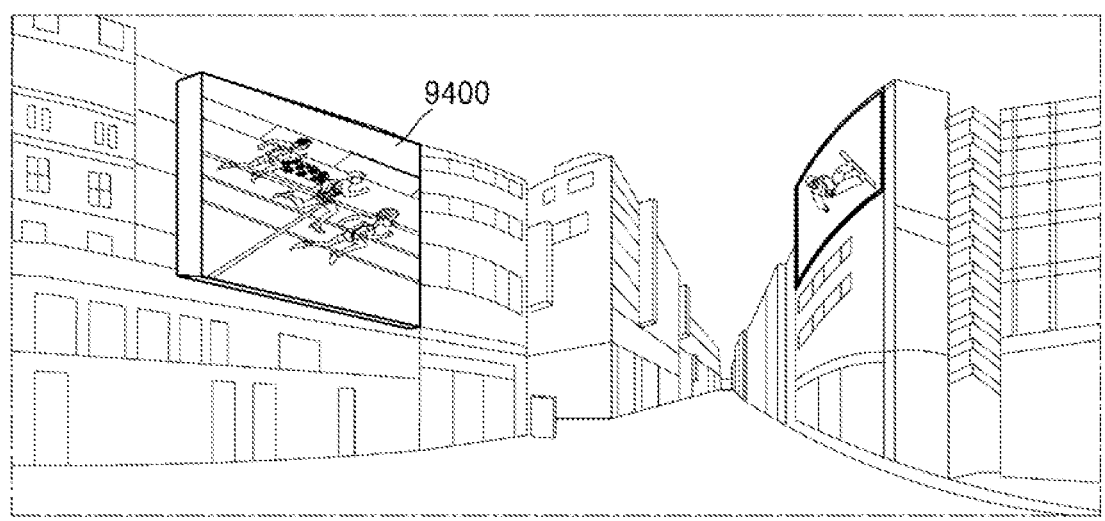
FIG. 17 is a diagram illustrating an embodiment of a signage as an application example of an electronic device.

FIG. 17 is a diagram illustrating an embodiment of a signage as an application example of an electronic device. A signage 9400 may include the display described with reference to FIG. 12. The signage 9400 may include at least one of the light-emitting device 10 described with reference to FIGS. 1 to 11. A signage 9400 may be used in outdoor advertising using a digital information display, and may control contents, etc. of an advertisement though a network. The signage 9400 may be implemented by, for example, the electronic device described with reference to FIG. 13.

Figure 18:
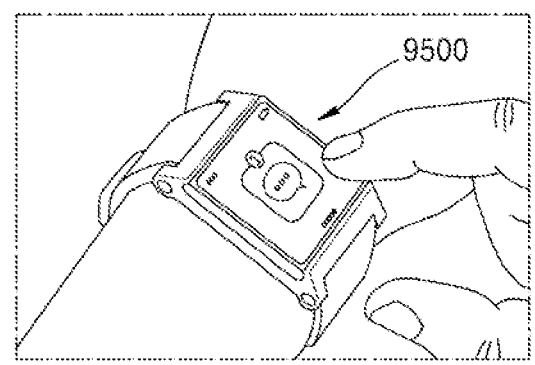
FIG. 18 is a diagram of an embodiment of a wearable display as an application example of an electronic device.

FIG. 18 is a diagram of an embodiment of a wearable display as an application example of an electronic device. A wearable display 9500 may include the display described with reference to FIG. 12. The wearable display 9500 may include at least one of the light-emitting device described with reference to FIGS. 1 to 11, and may be implemented by the electronic device described with reference to FIG. 13.

The light-emitting device or the display including the light-emitting device according to an embodiment may also be applied to various products such as rollable TV, stretchable display, etc.

According to embodiments of the light-emitting device, a monolithic light-emitting device configured to generate multi-wavelength light may be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A light-emitting device comprising:
   a base semiconductor layer;
   a three-dimensional (3D) light-emitting structure on the base semiconductor layer, the 3D light-emitting structure comprising at least one semi-polar surface;
   a flat light-emitting structure on the base semiconductor layer, the flat light-emitting structure comprising a polar surface, wherein the flat light-emitting structure generates light having a wavelength different from a wavelength of light generated by the 3D light-emitting structure; and
   a strain-relieving layer formed on the base semiconductor layer in an area of the light-emitting device in which at least the flat light-emitting structure is formed, wherein the strain-relieving layer relieves lattice mismatch between the base semiconductor layer and the flat light-emitting structure, wherein the wavelength of the light generated by the flat light-emitting structure is longer than the wavelength of the light generated by the 3D light-emitting structure.

2. The light-emitting device of claim 1, wherein the strain-relieving layer comprises a superlattice layer.

3. The light-emitting device of claim 1, wherein the base semiconductor layer, the 3D light-emitting structure, and the flat light-emitting structure comprise a GaN-based material, and
wherein the strain-relieving layer comprises a GaN-based superlattice layer.

4. The light-emitting device of claim 1, wherein an indium composition of the flat light-emitting structure is higher than an indium composition of the 3D light-emitting structure.

5. The light-emitting device of claim 1, wherein the 3D light-emitting structure comprises a first light-emitting structure and a second light-emitting structure, which generate light of different wavelengths from each other.

6. The light-emitting device of claim 5, wherein the first light-emitting structure and the second light-emitting structure generate blue light and green light, respectively, and
wherein the flat light-emitting structure generates red light.

7. The light-emitting device of claim 1, wherein a mask layer comprising a pattern is further formed on the base semiconductor layer,
wherein a first conductivity type semiconductor layer of the 3D light-emitting structure is grown on the base semiconductor layer through the pattern, and
wherein the pattern comprises a hole pattern or a stripe pattern.

8. The light-emitting device of claim 7, wherein the mask layer comprises at least one from among $SiO_2$, $TiO_2$, $Si3N_4$, $Al_2O_3$, TiN, AlN, $ZrO_2$, TiAlN, and TiSiN.

9. The light-emitting device of claim 7, wherein the 3D light-emitting structure comprises a first light-emitting structure and a second light-emitting structure, which generate light of different wavelengths from each other,
wherein the pattern comprises a first pattern which corresponds to the first light-emitting structure and a second pattern which corresponds to the second light-emitting structure,
wherein the first pattern comprises a first hole pattern or a first stripe pattern, and
wherein the second pattern comprises a second hole pattern or a second stripe pattern.

10. The light-emitting device of claim 9, wherein the first pattern and the second pattern are different in at least one of size and pitch.

11. The light-emitting device of claim 10, wherein the second light-emitting structure generates light having a longer wavelength than that of the first light-emitting structure, and
wherein a pitch of the second pattern is greater than a pitch of the first pattern.

12. The light-emitting device of claim 1, wherein the strain-relieving layer is formed on the base semiconductor layer in an area including an area in which the flat light-emitting structure is formed and an area in which the 3D light-emitting structure is formed.

13. The light-emitting structure of claim 12, wherein a mask layer comprising a pattern is further formed on the strain-relieving layer,
wherein a first conductivity type semiconductor layer of the 3D light-emitting structure is grown on the strain-relieving layer through the pattern, and wherein the pattern comprises a hole pattern or a stripe pattern.

14. The light-emitting device of claim 1, wherein the base semiconductor layer comprises GaN doped with a first conductivity type impurity.

15. The light-emitting device of claim 14, wherein the 3D light-emitting structure comprises a GaN-based light-emitting structure comprising a first conductivity type semiconductor layer formed in a 3D shape, an active layer comprising a multi-quantum-well structure covering a surface of the first conductivity type semiconductor layer, and a second conductivity type semiconductor layer covering the active layer.

16. The light-emitting device of claim 14, wherein the flat light-emitting structure comprises a GaN-based light-emitting structure comprising a first conductivity type flat semiconductor layer, a flat active layer comprising a multi-quantum-well structure on the first conductivity type flat semiconductor layer, and a second conductivity type flat semiconductor layer on the flat active layer.

17. A light-emitting device comprising:
a base semiconductor layer;
a strain-relieving layer on the base semiconductor layer;
a mask layer comprising a pattern, wherein the mask layer is arranged on the strain-relieving layer and the pattern comprises a hole pattern or a stripe pattern;
a GaN-based three-dimensional (3D) light-emitting structure comprising:
a first conductivity type semiconductor layer grown on the strain-relieving layer through the pattern, the first conductivity type semiconductor layer comprising a surface comprising at least one semi-polar surface,
an active layer comprising a multi-quantum-well structure covering the surface of the first conductivity type semiconductor layer, and
a second conductivity type semiconductor layer covering the active layer; and
a GaN-based flat light-emitting structure comprising:
a first conductivity type flat semiconductor layer on the strain-relieving layer,
a flat active layer grown on a polar surface on the first conductivity type flat semiconductor layer, and
a second conductivity type flat semiconductor layer on the flat active layer,
wherein the flat light-emitting structure generates light having a longer wavelength than a wavelength of light generated by the 3D light-emitting structure.

18. The light-emitting device of claim 17, wherein the base semiconductor layer comprises an n-GaN layer, and
wherein the strain-relieving layer comprises an InGaN-superlattice layer.

19. The light-emitting device of claim 17, wherein an indium composition of the flat light-emitting structure is higher than an indium composition of the 3D light-emitting structure.

20. The light-emitting device of claim 17, wherein the 3D light-emitting structure comprises a first light-emitting structure and a second light-emitting structure, which generate light of different wavelengths from each other.

21. The light-emitting device of claim 20, wherein the first light-emitting structure and the second light-emitting structure generate blue light and green light, respectively, and
wherein the flat light-emitting structure generates red light.

22. A display comprising:
a display panel comprising a plurality of light-emitting devices according to claim 1, and a driving circuit switching on or off the plurality of light-emitting devices; and
a controller configured to input an on-off switching signal of the plurality of light-emitting devices to the driving circuit according to an image signal.

23. An electronic device comprising the display of claim 22.

24. The electronic device of claim 23, wherein the electronic device comprises any one from among a head-up display device for a vehicle, a mobile.

\* \* \* \* \*